United States Patent
Gopal

(10) Patent No.: US 9,998,142 B1
(45) Date of Patent: Jun. 12, 2018

(54) TECHNIQUES FOR INVARIANT-REFERENCE COMPRESSION

(71) Applicant: INTEL CORPORATION, Santa Clara, CA (US)

(72) Inventor: Vinodh Gopal, Westborough, MA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 15/718,303

(22) Filed: Sep. 28, 2017

(51) Int. Cl.
*H03M 7/30* (2006.01)

(52) U.S. Cl.
CPC .......... *H03M 7/3086* (2013.01); *H03M 7/30* (2013.01)

(58) Field of Classification Search
None
See application file for complete search history.

(56) References Cited

U.S. PATENT DOCUMENTS

| | | | | |
|---|---|---|---|---|
| 5,640,158 A * | 6/1997 | Okayama | ............ | H03M 7/3086 341/51 |
| 5,850,565 A * | 12/1998 | Wightman | .......... | H03M 7/3084 710/1 |
| 9,258,013 B1 * | 2/2016 | Chau | ................... | H03M 7/6023 |
| 9,479,383 B2 * | 10/2016 | Bhaskar | .............. | H03M 7/3088 |

OTHER PUBLICATIONS

Deutsch, P., "DEFLATE Compressed Data Format Specification—RFC1951", <http:www.faqs.org/rfcs/rfc1951.html>, May 1996, 15 pages.
Huffman, D. A. , "A Method for the Construction of Minimum Redundancy Codes", Proceedings of the Institute of Radio Engineers, Sep. 1952, vol. 40, No. 9, 4 pages.
Ziv et al., "A Universal Algorithm for Sequential Data Compression", IEEE Transactions on Information Theory, vol. 23, No. 3, 7 pages.

* cited by examiner

*Primary Examiner* — Howard Williams

(57) ABSTRACT

Techniques and apparatus for performing an invariant-reference compression/decompression process are described. In one embodiment, for example an apparatus to generate invariant-reference compressed data may include at least one memory and logic, at least a portion of comprised in hardware coupled to the at least one memory, the logic to access input data comprising a plurality of literals and a plurality of repeating sequences, and perform an invariant-reference compression process to generate the invariant-reference compressed data, the invariant-reference compression process comprising determining a relative distance for each of the plurality of repeating sequences, the relative distance comprising a bit offset in the invariant-reference compressed data, and encoding each of the plurality of repeating sequences as a reference token in the invariant-reference compressed data, the reference token comprising the relative distance and a length. Other embodiments are described and claimed.

25 Claims, 9 Drawing Sheets

Table A 302

| Symbol 310 | Bit Length 312 |
|---|---|
| A | 2 |
| B | 4 |
| C | 3 |
| Len=2 | 3 |
| Len=3 | 4 |
| Len=4 | 4 |

314 (brace for A, B, C)
316 (brace for Len=2, Len=3, Len=4)

Table B 304

| Token 350 | Starting Bit Position in Compressed Stream 352 | Starting Byte Position in Uncompressed Stream 354 | Bit Length of Token 356 |
|---|---|---|---|
| A | 0 | 0 | 2 |
| <bit-dist=2, len=2> | 2 | 1 | 1+3 |
| C | 6 | 3 | 3 |
| <bit-dist=9-2, len=4> | 9 | 4 | 5+4+1 (extra-bit to select) |

```
                                605
Loop (until end of stream){
        decode literal/length symbol from input stream (LL-Huffman code)
        if value < 256 copy value (literal byte) to output stream
        else < // reference (value = 257...285)
                convert value to effective length
                decode bit distance symbol from input stream (D-Huffman code)
                start_bit = (current_bit_position) - (bit_distance)
                find row R in compression table that matches start_bit
                get start byte position P from row R
                if row R is a reference of length prev_length{
                        compute #extra_bits = log$_2$(prev_length)
                        read eb = #extra_bits from compressed stream
                        P += eb
                }
                copy length bytes from position P in 32KB history to output stream.
        } //end reference
        add new row to compression table for the new token and current bit position
        current_bit_position += number of bits of the last token (including #extra_bits
(if any))
        } //end loop
```

*FIG. 6*

TECHNIQUES FOR INVARIANT-REFERENCE COMPRESSION

TECHNICAL FIELD

Embodiments herein generally relate to information processing, and more particularly, to data compression and decompression techniques.

BACKGROUND

Computing and network systems rely on the use of compressed data in order to meet the demands of data storage and delivery. In general, compression processes may be employed to reduce the size of data without sacrificing the information contained within the data. Data consumers are required to decompress the compressed files before using the data. Errors introduced into compressed data during the compression processes may lead to corrupt data. Even a 1-bit error in a compressed bit stream may cause large portions of a compressed bit stream to be unusable by a data consumer.

BRIEF DESCRIPTION OF THE DRAWINGS

FIG. 3 illustrates an embodiment of compression information.

FIG. 6 illustrates an embodiment of pseudocode for an invariant-reference decompression process.

DETAILED DESCRIPTION

Figure 1A:
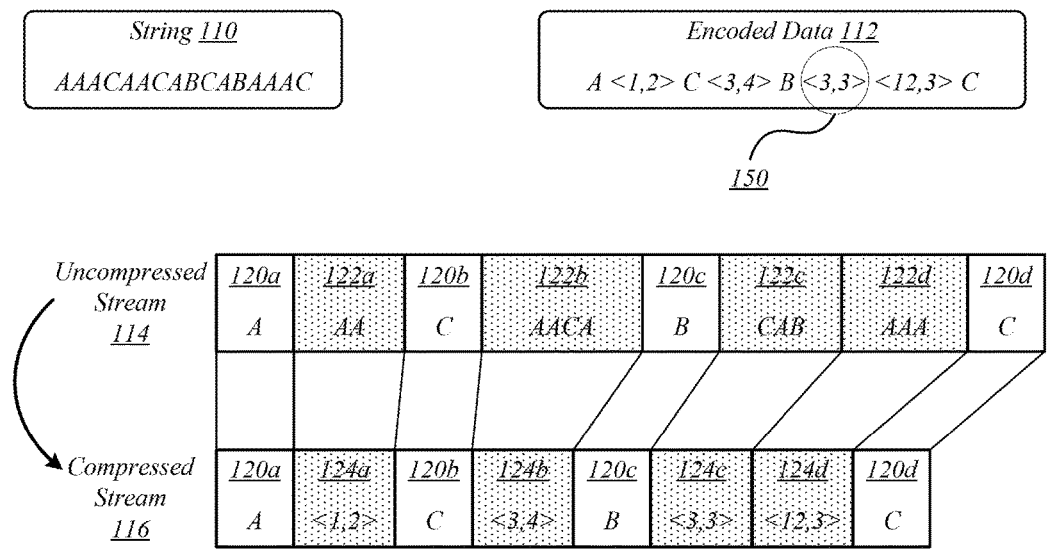
FIGS. 1A and 1B depict an example compression and decompression process.

Various embodiments may be generally directed to techniques for data compression and decompression provided by a computer system. In some embodiments, the computer system may include an invariant-reference compression logic and/or may be able to perform an invariant-reference compression process. The invariant-reference compression logic may be configured to compress data using invariant-distance references that refer to the compressed stream, as opposed to distance references in the decompressed stream as in conventional processes. The invariant-distance references may be used to encode references (for instance, a replicated symbol or a replicated string of symbols). The invariant-reference logic may include and/or use one or more compression processes (or modified versions thereof). Non-limiting examples of compression processes may include lossless data compression, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like. In some embodiments, the invariant-reference logic may include and/or be an LZ77 or LZ77-based compression process or logic in which the reference distances (for instance, distance, offset, relative jump, backward distance, and/or the like) are invariant-references that refer to the compressed data stream. For example, the invariant-reference may include a bit offset into the compressed data stream. Although LZ77 and Deflate are used as examples, embodiments are not so limited. In particular, compression processes capable of operating according to some embodiments are contemplated herein, including, as non-limiting examples, Joint Photographic Experts Group (JPEG), Moving Picture Experts Group (MPEG), and/or other compression and decompression streams.

As used in this application, the terms "logic," "component," "layer," "system," "circuitry," and/or "module" are intended to refer to a computer-related entity, either hardware, a combination of hardware and software, software, or software in execution, examples of which are provided by the exemplary computing architecture 900. For example, a logic, circuitry, or a layer may be and/or may include, but are not limited to, a process running on a processor, a processor, a hard disk drive, multiple storage drives (of optical and/or magnetic storage medium), an object, an executable, a thread of execution, a program, a computer, hardware circuitry, integrated circuits, application specific integrated circuits (ASIC), programmable logic devices (PLD), digital signal processors (DSP), field programmable gate array (FPGA), memory units, logic gates, registers, semiconductor device, chips, microchips, chip sets, software components, programs, applications, firmware, software modules, computer code, combinations of any of the foregoing, and/or the like.

In general, the conventional LZ77 compression process operates by replacing repeated occurrences of data with references to a single copy of that data existing earlier in the input (uncompressed) data stream. A match is encoded by a pair of numbers called a length-distance pair ("distance" may be referred to as an "offset"). As such, the conventional LZ77 compression process finds repeated substrings and replaces them with backward references (relative distance offsets). The conventional LZ77 compression process can use a reference to a duplicated string if the relative distance is less than the maximal history size defined in the algorithm encoding (for instance, 32 KB in Deflate). The compressed data consists of a series of elements of two types: literal bytes (copy of the data) and pointers to replicated strings, where a pointer is represented as the pair <length, backward distance>. The various algorithms in the conventional LZ77 family all find LZ77 string matches during compression, but encode the literals or references differently (for instance, Huffman codes in Deflate, simple byte-oriented packing in Snappy, and/or the like), and have different maximal history windows. In general, a literal may include raw encoded data (as opposed to data encoded as a length, distance pair).

To spot matches, the conventional LZ77 encoder keeps track of some amount of the most recent data, such as the last 2 kB, 4 kB, 32 kB, and/or the like. The structure in which this data is held is called a "sliding window" (accordingly, LZ77 is sometimes referred to as sliding window compression). The encoder keeps the most recent data within the sliding window to look for matches (and the decoder likewise will keep this data to interpret the matches the encoder refers to).

During conventional LZ77 compression, bit patterns of a preceding (earlier or older) portion of a bit stream may be compared against a current portion (or current bit sequence) of the bit stream. If a sequence of bits is found in the current portion that matches a sequence of bits in the preceding portion (or preceding bit sequence), the sequence of bits in the current portion is replaced with a reference to the same sequence of bits in the earlier portion.

The reference that is inserted for the current bit sequence identifies the length of the current bit sequence and the location of the preceding bit sequence expressed, for instance, as a "distance" (or offset, relative jump, backward distance, and/or the like) from the current bit sequence to the matching preceding bit sequence. As such, the conventional LZ77 compression process encodes a bit sequence as a "length, distance pair" that is inserted in the bit stream in place of a current bit sequence. Upon decoding the compressed stream, when the decoder reaches the length, distance pair that is embedded in the bit stream, the decoder uses the distance part of the length, distance pair to refer back to the start of the matching bit sequence and reproduces the correct bit sequence of the decoded stream by reproducing a number of bits from the start of the matching bit sequence that is equal to the length component of the length, distance pair.

A non-limiting example of a conventional LZ77 compression process may be performed on the following illustrative sequence, recited in a form prior to compression: "AAAA BBBB CC DDD EEEE BBBB FFFF." During compression, the conventional LZ77 compression process may locate the match "BBBB," having a length of 6 (including spaces). The matching "BBBB" sequences have a match offset (for instance, an intervening distance) of 17. The compressed sentence may be in the following form: "AAAA BBBB CC DDD EEEE@(6,17)FFFF," with "(6,17)" being the length and distance pair associated with the BBBB match.

The conventional Deflate compression process is used as the basis of various compression platforms, such as gzip/Zlib and Winzip/PKzip. In general, Deflate uses a series of blocks corresponding to successive blocks of input data. Each block may be compressed using a combination of the LZ77 compression process and Huffman coding. As described above, the conventional LZ77 compression process operates to find repeated substrings and replaces the repeated substrings with references, such as relative distance offsets. The conventional LZ77 compression process may use a reference to a duplicated string occurring in the same block or previous blocks, for instance, up to 32 KB previous input bytes. The compressed data may include a series of elements of two types: literal bytes and pointers to replicated strings (represented as the pair: <length, backward distance>). The conventional LZ77 compression process operates to find string matches at each position.

Using data structures to efficiently index locations where matching strings may be found, the conventional LZ77 compression process may operate to search a number of locations to determine a "best" match. The effort (for instance, the number of searches attempted) is specified by the compression level. For instance, gzip/Zlib defines a number of compression levels, ranging from 1 to 9, with 9 being the highest compression level and requiring the highest processing cost. A file may be represented as a series of tokens, where each token may represent a literal byte or a match of text that occurred previously (for instance, a "reference"). The tokens may be encoded using a variable-size code (for instance, a Huffman code followed by certain "extra bits").

Because the codes are of variable length, a simple strategy of trying to minimize the number of tokens may likely not result in the smallest output. For example, a 10-byte match that occurred a large distance previously in the data stream may take more bits to encode than a literal followed by a 9-byte match that is closer. In another example, an input sequence having a 10-byte match may be followed by two literal tokens, while if the first byte of that sequence were represented by a literal, an 11-byte match may be located. Accordingly, Deflate may use "lazy matching" in which the compression process may find a match at a given point, then look for a match one byte further and if the second match is longer than the first match, the compression process emits a literal. In general, lazy matching involves the compression process optionally deferring the selection of matches. For example, after a match of length X has been found, the compression process searches for a longer match starting at the next input byte. If the compression process finds a longer match, the compression process truncates the previous match to a length of one (thus producing a single literal byte) and then emits the longer match. Otherwise, the compression process emits the original match, and advances N bytes before continuing.

Corruption of compressed data may cause large portion of a compressed data stream to be unusable to a data consumer as the decompression process is not able to properly decompress the corrupt data. Because compressed data uses bits involving relative data (for instance, relative distance between a symbol and a literal) and absolute values (for instance, length of a literal), even a 1-bit error may corrupt a large portion of a compressed data stream. Conventional approaches to preventing such corruption generally involve decompressing the compressed data stream to verify that it matches the original data, for example, before the compressed data is stored or otherwise committed permanently. Such techniques incur significant resource and time costs, particularly for large files. Accordingly, compression and decompression techniques are needed that are not prone to errors in the compressed data. However, because conventional verification techniques require decompression, system performance is substantially degraded due to the required decompression process. In addition, verification only protects against transient errors that arise during the compression process, but errors in a compression stream and/or compressed file may appear during storage, transmission, or the like. Although a limited number of error (for instance, bit flips) may be tolerated due to the use of error checking (for instance, ECC) and redundancy, recovery from substantial errors may not be possible, particularly when the substantial errors occur early in the compressed stream, rendering all subsequent data useless.

Figure 1B:
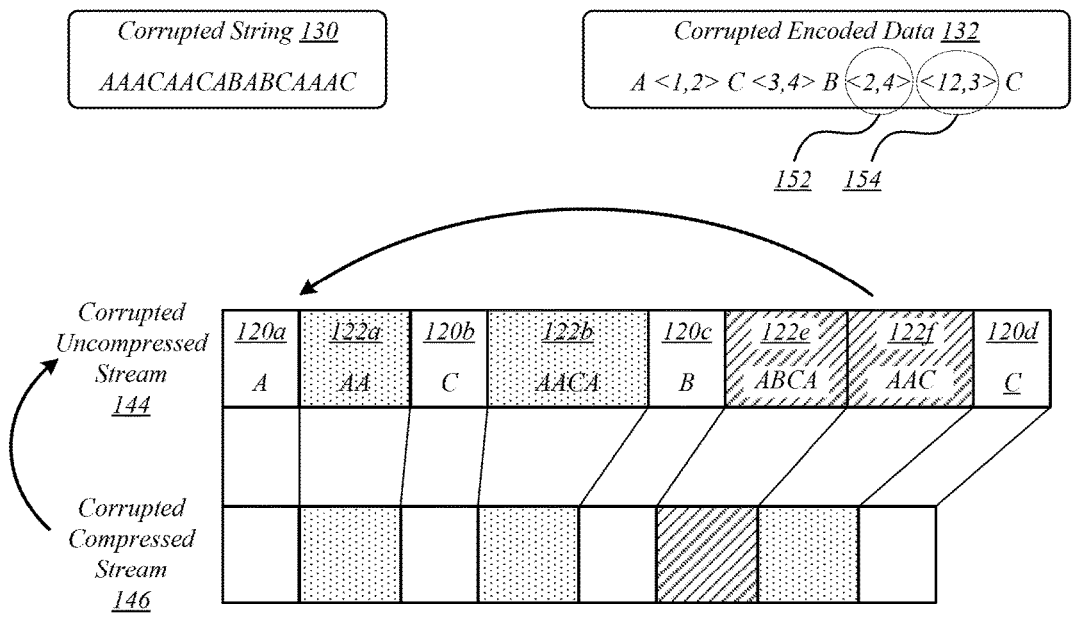

FIGS. 1A and 1B depict an example compression and decompression process. More specifically, FIG. 1A depicts an example of data compression using the LZ77 compression process and FIG. 1B depicts an example of decompression of LZ77-compressed data experiencing an error or corrupt encoded data. As shown in FIG. 1A, a string 110 may be compressed using an LZ77 compression process to generate encoded data 112. In the illustrative LZ77 compression process illustrated in FIG. 1A, a reference having a length of 1 may be encoded for illustrative purposes, although typical compressors will have minimum match lengths or windows greater than 1. The notation <x,y> depicted for encoded data 112 stands for a relative distance x in uncompressed stream 114 and a length y. Uncompressed stream 114 includes literals 120a-d and repeated elements 122a-d. Compressed stream 116 includes repeated elements 122a-d as references or tokens 124a-d.

As shown in FIG. 1B, reference 152 of corrupted encoded data 132 of corrupted compressed stream 146 has been corrupted (for example, via a bit-flip) as <2,4> instead of <3,3> of corresponding reference 150 of encoded data 112. Accordingly, reference 152 is decoded as <2,4> instead of <3,3>, signifying a length of 4 from a relative distance of 2.

After decoding reference 152, the output string will read "AAACAACABABCA" (for 120a-c and 122a-e of corrupted uncompressed stream 144 up to reference 152) instead of "AAACAACABABA" (for the corresponding portion of uncompressed stream 114 up to reference 150) Even if the reference 154 is decoded correctly, the corrupted string 130 will be incorrect. In particular, the incorrect sub-string "aac" is generated instead of "aaa," even though the reference 154 is decoded correctly. This is because the back-ward references in conventional compression processes, such as an LZ77 compression process, are based on positions in the original uncompressed stream. Thus, if at any point more or less literals are inserted into decompressed data, then any subsequent reference distances that point to an earlier position will get improper offsets and, therefore, errors will continue to propogate through the decompressed data despite correct decoding. Such corruption may be especially pronounced for compression standards that include large history sizes (for instance, MB-size histories), such as Zstandard and Broth.

According, some embodiments provide an invariant-reference compression/decompression process in which the references point to data in the compressed data. For example, in various embodiments, the reference distances may include offsets (such as bit offsets) into the compressed data stream. Referring to the corrupted decompression process depicted in FIG. 1B, a bit-flip that corrupted reference 152 will not affect subsequent references, such as reference 154, because subsequent references may be encoded as invariant references having a general form of <offset in compressed stream, distance>. For example, reference 154 may be encoded as an invariant reference as <bit offset in compressed stream 116, 3>. The invariant-reference compression/decompression process according to some embodiments may determine the required byte of a back-ward reference that refers to a literal byte that has been encoded as part of a reference in the compressed stream. For example, the invariant-reference compression/decompression process according to some embodiments may encode the bit-offset directly when that bit-offset is of a literal byte symbol, but may also use extra-bits to signify a further offset from the start of a reference token for the actual required position. Accordingly, the invariant-reference logic according to some embodiments may operate via, among other things, using invariant references to the compressed data instead of relative references to the decompressed data as in conventional systems.

Figure 2:
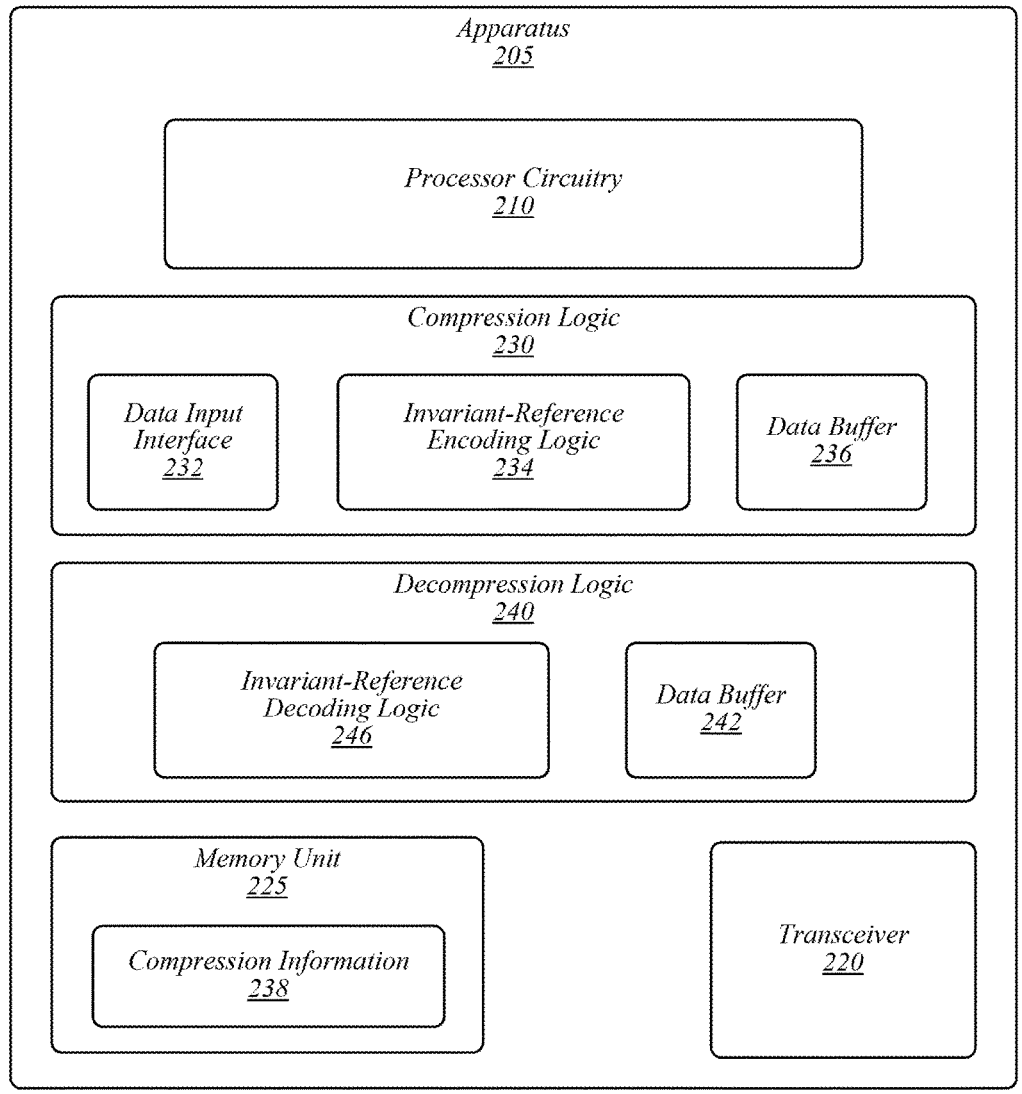
FIG. 2 illustrates an embodiment of a first operating environment.

FIG. 2 illustrates an example of an operating environment 200 that may be representative of various embodiments. The operating environment 200 depicted in FIG. 2 may include an apparatus 205 having a processor circuit 210, a memory unit 225, and a transceiver 220. Processing circuitry 210 may include and or may access logic having instructions for performing operations according to some embodiments. Processing circuitry 210 may be communicatively coupled to memory unit 225 and/or transceiver 220.

As shown in FIG. 2, apparatus 205 may include a compression logic 230. In various embodiments, compression logic 230 may include or be disposed within a processor circuit, such as processing circuitry 210, a system-on-a-chip (SoC), a field-programmable gate array (FPGA), an accelerator, and/or the like. In some embodiments, compression logic 230 may include a processor circuit. In some embodiments, compression logic 230 may be implemented in software, firmware, hardware, or any combination thereof. In various embodiments, compression logic 230 may be implemented in hardware configured to execute software, firmware, and/or the like to perform operations according to some embodiments.

Compression logic 230 may include a data input interface 232 configured to access data (for instance, "uncompressed data") to be compressed via compression logic 230. Data input interface 232 may receive data input from various sources, including software applications or threads, hardware elements, data buffers, and/or the like. In various embodiments, the uncompressed data in the form of a data sequence or stream may be received or otherwise accessed by compression logic 230 via data input interface 232. A data buffer 236 may be used to store data, such as intermediate data, data waiting to be compressed, compressed data waiting to be transmitted, and/or the like. Furthermore, compression logic 230 may output a compressed data stream generated by compression logic 230, for instance, to a data consumer and/or other components of apparatus 205.

In some embodiments, compression logic 230 may include an invariant-reference encoding logic 234. In some embodiments, invariant-reference encoding logic 234 may be implemented in hardware, software, firmware, or any combination thereof. In various embodiments, invariant-reference encoding logic 234 may include one or more of a compression engine, encoder, algorithm, process, software application, firmware application, processor, co-processor, FPGA, and/or the like. In some embodiments, invariant-reference encoding logic 234 may include a plurality of instances of a single compression component or encoder. Invariant-reference encoding logic 234 may include various numbers of compression components (or instances of compression components).

In exemplary embodiments, invariant-reference encoding logic 234 may be configured to generate invariant-reference compressed data by encoding or otherwise compressing source data received, for instance, through data input interface 232 using an invariant-reference compression process according to some embodiments. In some embodiments, the invariant-reference compression process may be based on various compression process, including, without limitation, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like. Although LZ77 and Deflate are used as examples, embodiments are not so limited. In particular, other or additional compression processes capable of operating according to some embodiments are contemplated herein. In some embodiments, the invariant-reference compression process may include a compression process configured to generate references pointing to positions within compressed data and processes for handling the generation of such references (see, for example, FIGS. 3 and 4). For example, the invariant-reference compression process performed by invariant-reference encoding logic 234 may include an LZ77-based compression process in which the position reference of a token points to a location in the invariant-reference compressed data being generated by the LZ77-based compression process (compared with the position reference pointing to a position in the uncompressed data stream as is done in a conventional LZ77 compression process).

In some embodiments, invariant-reference encoding logic 234 may be configured to generate compression information 238. Non-limiting examples of compression information 238 may include symbol information, symbol length, symbol locations, compression offset(s), skip values, compression level, compression type, and/or the like. In some embodiments, compression information 238 may include a compression table or map (see, for example, FIG. 3) to store information indicating positions within compressed data generated by invariant-reference encoding logic 234 and/or data within an uncompressed stream (for example, decompressed input data and/or decompressed data resulting from the invariant-reference decompression process). In exemplary embodiments, the compression information 238 may include starting positions in compressed data, starting positions in decompressed data, reference or token lengths, and/or the like. For example, a compression may of compression information 238 may include tokens, literals, symbols, encoding lengths of tokens, literals, and/or symbols, starting positions (for instance, bit positions) in compressed data, and/or starting positions (for instance, byte positions) in uncompressed data. In some embodiments, compression information 238 or portions thereof may be stored with associated compressed data, for example, as metadata. In some embodiments, compression information 238 or portions thereof may be stored in memory unit 225.

Apparatus 205 may include a decompression logic 240 having or operably coupled to an invariant-reference decoding logic 246. In various embodiments, decompression logic 240 and/or invariant-reference decoding logic 246 may include or be disposed within a processor circuit, such as processing circuitry 210, an SoC, an FPGA, an accelerator, and/or the like. In some embodiments, decompression logic 240 and/or invariant-reference decoding logic 246 may include a processor circuit. In some embodiments, decompression logic 240 and/or invariant-reference decoding logic 246 may be implemented in software, firmware, hardware, or any combination thereof. In various embodiments, decompression logic 240 and/or invariant-reference decoding logic 246 may be implemented in hardware configured to execute software, firmware, and/or the like to perform operations according to some embodiments.

Decompression logic 240 may be operative to receive or otherwise access data, for example, to be decompressed via invariant-reference decoding logic 246 (for instance, "compressed data," "compressed files," "compressed data streams," "zip files," "encoded data," and/or the like). For instance, decompression logic 240 may receive data input from various sources, including compression logic 230 and components thereof, software applications or threads, hardware elements, data buffers, and/or the like. A data buffer 242 may be used to store data, such as intermediate data, data structures, data waiting to be decompressed, decompressed data waiting to be transmitted, compression information, portions thereof, and/or the like Invariant-reference decoding logic 246 may be configured to decompress or decode invariant-reference compressed data generated via an invariant-reference compression process according to some embodiments (see, for example, FIG. 5). Invariant-reference decoding logic 246 may be operative to access compression information 238, for instance, a compression table for use in decompressing invariant-reference compressed data. For instance, invariant-reference decoding logic 246 may determine starting bit positions for literals and/or tokens or token lengths in invariant-reference compressed data using the compression table.

FIG. 3 depicts compression information according to some embodiments. As shown in FIG. 3, compression information may include various maps or tables, such as Table A 302 and Table B 304. In some embodiments, Table A 302 may include a symbol table configured to include lengths 312 to symbols 310, such as literals 314 and length symbols 316. In various embodiments, the information of symbol table 302 may be generated by invariant-reference compression logic during compression of uncompressed data and/or accessed from a data source (for instance, pre-configured information). The values of bit lengths 312 may be based on various data, such as pre-programmed values, data size, storage space requirements, and/or the like. Table B 304 may be or may include compression information in the form of a compression table or map. Compression map 304 may include various information, including a token or token indicator 350 (e.g., text indicating a literal token or the reference information for a reference token), a starting bit position in compressed stream 352 (a "starting bit position"), a starting byte position in uncompressed stream 354 (a "starting byte positin"), and a bit length of toke 356. Accordingly, in some embodiments, an invariant-reference compression/decompression process may use various symbols 310 (which may include literals and/or references) and bit lengths 312 as provided in symbol table 302. In various embodiments, an invariant-reference compression/decompression process may determine symbols 310 and/or assign bit lengths 312 for symbols 310. In general, compression table 304 may map compressed bits per token into the corresponding uncompressed byte positions of the uncompressed data being compressed. As described with reference to FIG. 4, all or portions of symbol table 302 and/or compression map 304 may be generated by an invariant-reference compression process operating according to some embodiments. As described with reference to FIG. 5, all or portions of symbol table 302 and/or compression map 304 may be used by an invariant-reference decompression process operating according to some embodiments when decompressing data compressed via an invariant-reference compression process.

Included herein are one or more logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, hardware, or any combination thereof. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 4:
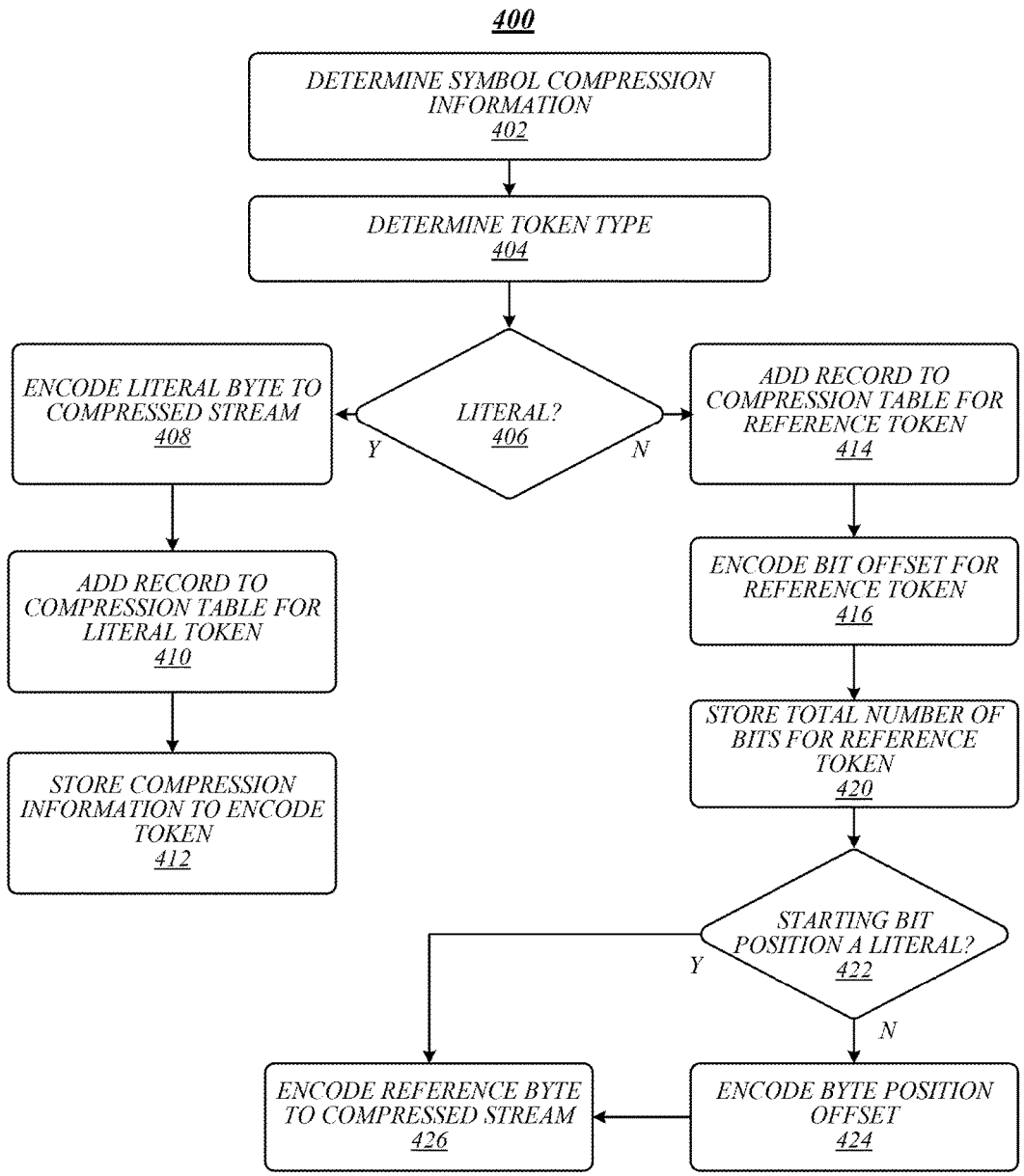
FIG. 4 illustrates an embodiment of a first logic flow.

FIG. 4 illustrates an embodiment of a logic flow 400. Logic flow 400 may be representative of some or all of the operations executed by one or more embodiments described herein, such as apparatus 205 and/or invariant-reference encoding logic 234. In some embodiments, logic flow 400 may be representative of some or all of the operations of an invariant-reference compression process operative to compress data using an invariant-reference compression process.

Logic flow 400 may determine symbol compression information at block 402. For example, invariant-reference encoding logic 234 may determine or otherwise access compression information indicating symbols and bit lengths. For uncompressed stream 114, for example, invariant-reference encoding logic 234 may generate or access symbol table 302, which assigns the various literals and length symbols for uncompressed data. As invariant-reference encoding logic 234 encodes string 110, the starting bit position in the compressed stream of every token is recorded. An LZ77 encoding of string 110 would have produced encoded data 112 ("A<1,2> C<3,4> B<3,3> <12, 3> C").

At block 404, logic flow 400 may determine a token type (for instance, a literal or a reference). For example, invariant-reference encoding logic 234 may receive or otherwise access an uncompressed data element, such as a compressed file or stream. Invariant-reference encoding logic 234 may analyze a first portion of the uncompressed data element (for instance, the start of the uncompressed data element), such as the first element of uncompressed stream 114. Using a function of a compression process, such as an LZ77 or LZ77-based compression process, invariant-reference encoding logic 234 may determine whether the first token of the uncompressed data element is a literal or a reference.

If the token is a literal at decision block 406, logic flow 400 encode a literal byte to the compressed stream at block 408. For example, if a new token is a literal byte, invariant-reference encoding logic 234 may push the bits needed to encode the literal to the compressed data stream. For uncompressed stream 114, invariant-reference encoding logic 234 may determine that the first token is the literal "A." Invariant-reference encoding logic 234 may encode the literal "A," pushing 2 bits into the compressed stream (based on the bit length of "A" in symbol table 302).

Logic flow 400 may add a record to the compression table for the literal token at block 410. For example, invariant-reference encoding logic 234 may add a row in the compression table for the literal token. For uncompressed stream 114, invariant-reference encoding logic 234 may generate row 360 in compression table 304. At block 412, logic flow 400 may store compression information to encode the token. For example, invariant-reference encoding logic 234 may record the token, the starting bit position in the compressed stream, the byte position in the original uncompressed data (for instance, file, stream, and/or the like) containing the literal, and the number of bits to encode the literal in the record associated with the token. For uncompressed stream 114, invariant-reference encoding logic 234 may record the compression information of starting bit position in compressed stream 352, starting byte position in uncompressed stream 354, and bit length of token 356 in row 360 for token "A." In another example, for literal token "C," invariant-reference encoding logic 234 may generate row 364 in compression table 302.

If the token is not a literal at decision block 406, logic flow 400 may add a record to the compression table for the reference token. For example, invariant-reference encoding logic 234 may add a row in the compression table for the reference token. For uncompressed stream 114, invariant-reference encoding logic 234 may generate row 362 in compression table 304 for the reference token "<1,2>" having a length determined by symbol table 302 (for instance, a length of 2 requires a 3-bit code). The relative distance for reference token "<1,2>" is 2 bits as that is the position of literal "A," which may require, for example, 1 bit to encode. Accordingly, as indicated in bit length of token 356 in row 362 for reference token "<1,2>" is 1 (relative distance)+3 (bit length of length=2).

At block 416, logic flow 400 may encode the bit offset for the reference token. For example, invariant-reference encoding logic 234 may determine the relative distance in the uncompressed stream and find the row in the compression table where the byte position lies to determine the byte offset as the difference between the current bit count and the starting bit position for that row. Invariant-reference encoding logic 234 may encode the bit offset for the reference token. Logic flow 400 may store the total number of bits for the reference token at block 420. For example, invariant-reference encoding logic 234 may record the number of bits added for the reference token (for instance, length+bit offset).

Logic flow 400 may determine whether the starting position of the reference token is a literal at block 422. For example, invariant-reference encoding logic 234 may determine whether the starting position of the reference token is a row of a literal in compression table 304. If the starting position of the reference token is a literal at block 422, logic flow 400 may encode the byte position offset at block 424. For example, invariant-reference encoding logic 234 may encode an offset from the start of the previous reference row to get the desired byte position. At block 426, logic flow may encode reference byte to compressed stream. For example, invariant-reference encoding logic 234 may encode the reference byte corresponding to the reference token in the compressed stream, such as "<bit-dist=2, len=2>" for reference token "<1,2>."

As an example of the invariant-reference compression process depicted in FIG. 4, invariant-reference encoding logic 234 may generate row 366 for reference token "<3,4>" of encoded data 112 in compression table 304. Reference token "<3,4>" points back to the literal "A," which is at position 1 in the original data stream of uncompressed stream 114, which was encoded as a reference of length 2. Accordingly, invariant-reference encoding logic 234 may point to the start of the symbol "A" and add a final extra bit to indicate whether to pick the first or second literal from row 362. As an example, 5 bits may be required to encode the bit distance of 7. In reference to compression table 304, the first four tokens of uncompressed stream 114 may be encoded as "A<bit distance=2, length=2> C<bit distance= (9-2)=7, length=4>." Compression table 304 only depicts a compression table for partial compression of uncompressed stream 114 relating to the examples provided with respect to FIG. 4. A compression table for the full compression of uncompressed stream 114 would contain additional records resulting from the invariant-reference compression process according to some embodiments that are not included to simplify the figure.

Figure 5:
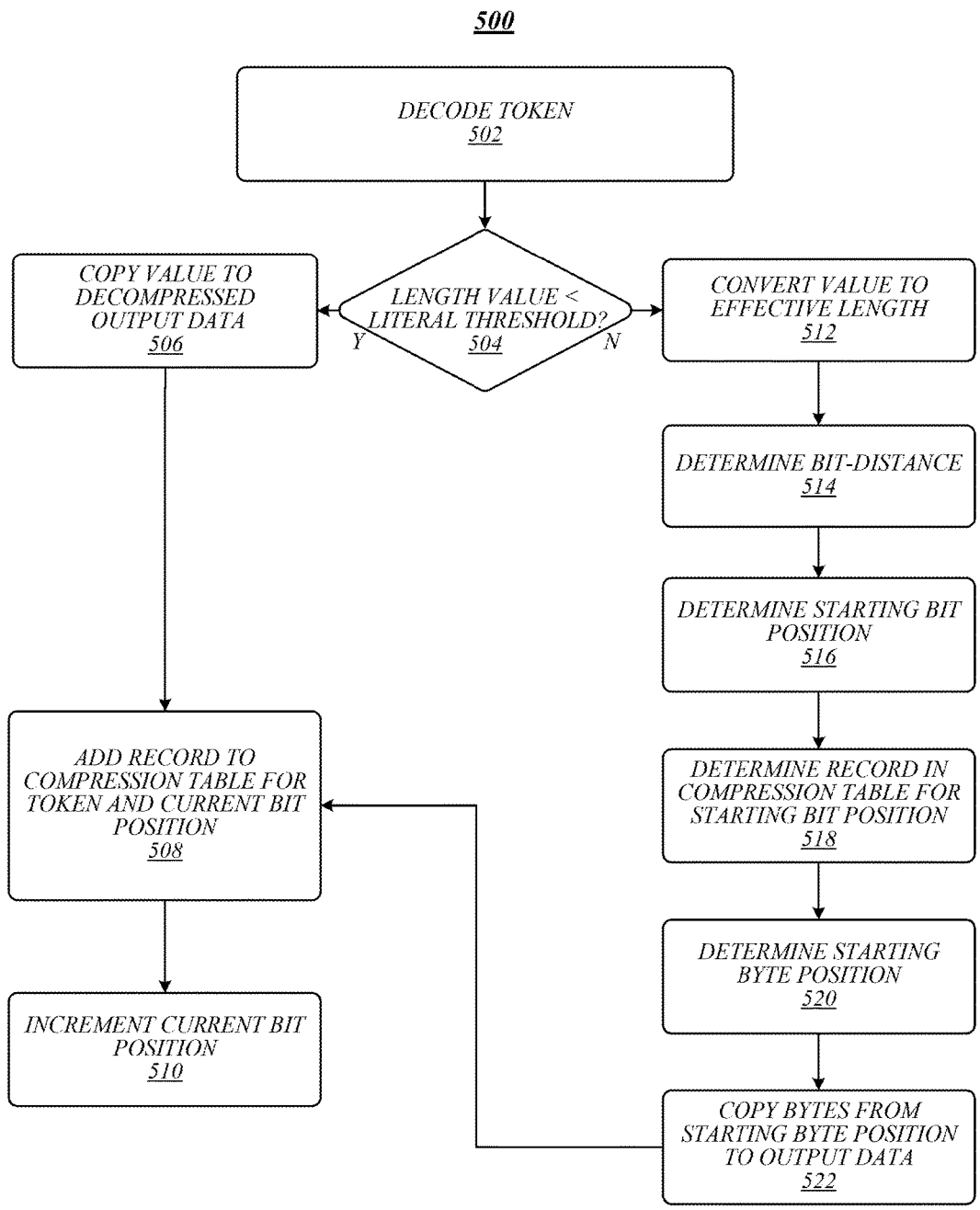
FIG. 5. illustrates an embodiment of a second logic flow.

FIG. 5 illustrates an embodiment of a logic flow 500. Logic flow 500 may be representative of some or all of the operations executed by one or more embodiments described herein, such as apparatus 205 and/or invariant-reference decoding logic 246. In some embodiments, logic flow 400 may be representative of some or all of the operations of an invariant-reference decompression process operative to decompress invariant-reference compression data. FIG. 6 illustrates an embodiment of pseudocode for an invariant-reference decompression process according to some embodiments. More specifically, FIG. 6 depicts pseudocode 605 for an invariant-reference decompression process operative according to logic flow 500.

Logic flow 500 may decode a token at block 502. For example, invariant-reference decoding logic 246 may determine a token (for instance, a literal/length (LL)-Huffman code) of an invariant-reference compressed data input stream (for instance, for one of the tokens "A<bit distance=2, length=2> C<bit distance=(9-2)=7, length=4> . . . " of invariant-reference compressed data resulting from the invariant-reference compression of uncompressed stream 114). Invariant-reference decoding logic 246 may determine a length value for the decoded token. At block 504, logic flow 500 may determine whether the length value of the token is greater than a literal threshold value. In some embodiments, the literal threshold value may be 256 bits, indicating, for example, a literal byte.

If logic flow 500 determines that the length value of the token is greater than the literal threshold value at block 504, logic flow 500 may copy the value to the output data at block 506. For example, invariant-reference decoding logic 246 may copy the literal byte to the decompressed output stream. At block 508, logic flow 500 may add a record to the compression table for the token and current bit position. For example, invariant-reference decoding logic 246 may add a new row to compression table 304 for the new token and current bit position based on the decoding of the token. Logic flow 500 may increment the current bit position at block 510. For example, invariant-reference decoding logic 246 determine that (current bit position)+=number of bits of the last token (including any extra bits as necessary).

If logic flow 500 determines that the length value of the token is not greater than the literal threshold value at block 504, logic flow 500 may convert the length value to an effective length at block 512. At block 514, logic flow 500 may determine a bit distance for the token. For example, invariant-reference decoding logic 246 may decode a bit distance symbol from the compressed input stream (for instance, a D-Huffman code). Logic flow 500 may determine a starting bit position at block 516. For example, invariant-reference decoding logic 246 may determine that (starting bit position)=(current bit position)−(bit distance). At block 518, logic flow 500 may determine the record in the compression table for the starting bit position. For example, invariant-reference decoding logic 246 may look up the row in the compression table 304 that matches the starting bit determined at block 516. Logic flow 500 may determine the starting byte position of the record at block 520. For example, invariant-reference decoding logic 246 may locate the value for starting byte position in uncompressed stream 354 for the token 350 in compression table 304. In some embodiments, if the record is a reference token having a length of the previous length of the previous token (for example, the previous row for a reference in compression table 304), invariant-reference decoding logic 246 may determine "extra bits" that need to be included to determine the starting byte position. The extra bits may be determined according to (extra bits)=log$_2$(previous length), determining an extra bits value by reading the extra bits from the compressed data stream, then adding the extra bits value to the starting byte position. At block 522, logic flow 500 may copy the bytes from the starting byte position to the output data. For example, invariant-reference decoding logic 246 may copy the length bytes from the starting byte position in the compression history (for instance, a 32 KB history) to the decompressed data output stream. At block 508, logic flow 500 may add a record to the compression table for the token and current bit position. Logic flow 500 may increment the current bit position at block 510.

Figure 7:
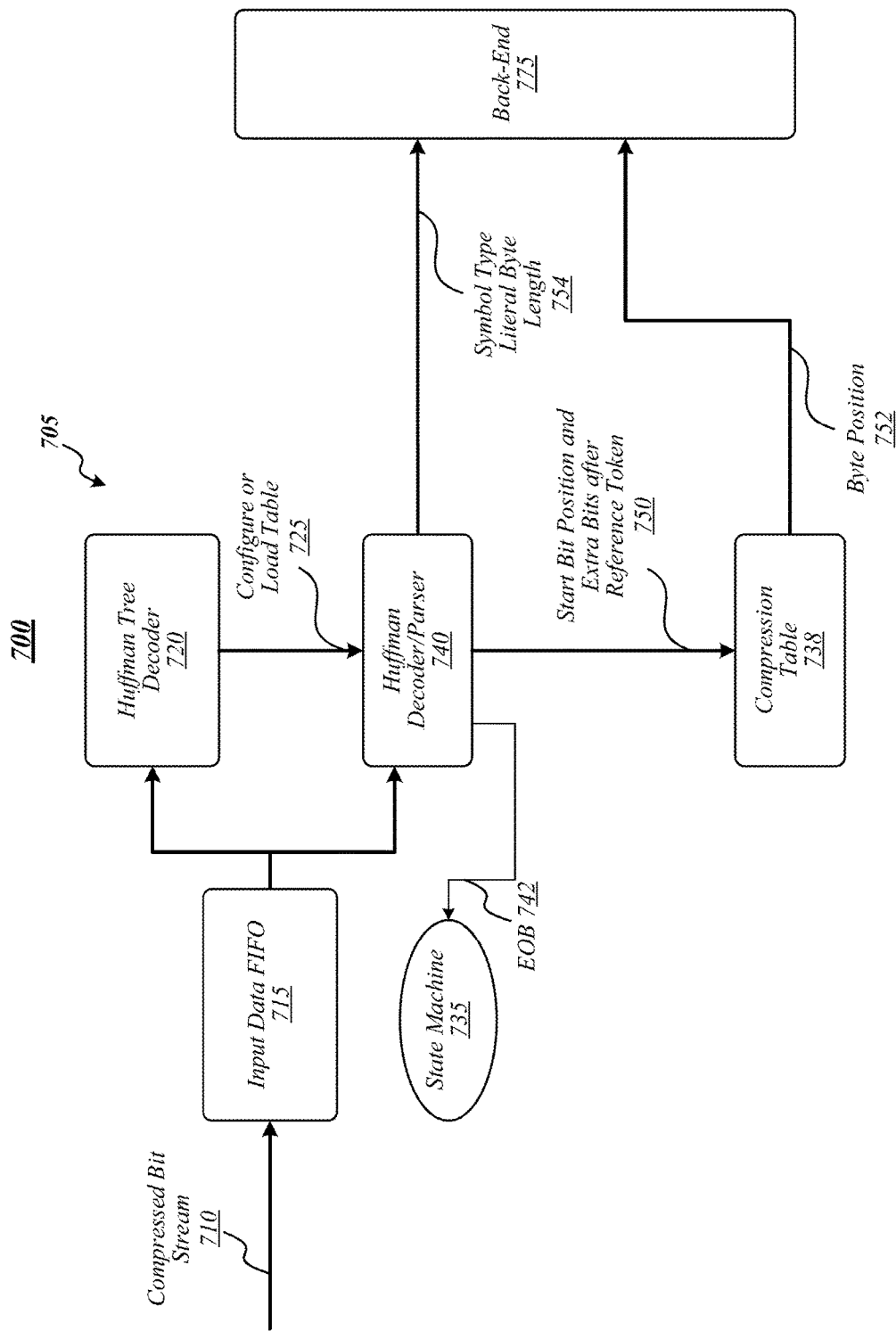
FIG. 7 illustrates an embodiment of a second operating environment.

FIG. 7 illustrates an example of an operating environment 700 that may be representative of various embodiments. The operating environment 700 depicted in FIG. 7 may include a decompressor 705 having a Huffman tree decoder 720 operative to provide configure tables 725 (for instance, Huffman trees) to Huffman decoders/parser 740. Although Huffman-based elements are used as examples, such as in FIG. 7, embodiments are not so limited as other decoders and parsers capable of operating according to some embodiments are contemplated herein.

As shown in FIG. 7, a compressed bit stream 710 may be received by decompressor 705 at an input data first-in first-out FIFO 715. Compressed bit stream 710 may include invariant-reference compressed data compressed using an invariant-reference compression process according to some embodiments. A state machine 735 configured to receive an end-of-block (EOB) 742 signal or other indicator from Huffman decoders/parser 740.

Decompressor 705 may include and/or may access a compression table 738 configured according to some embodiments. Start bit position and extra bits (for instance, 8 extra bits) after a reference token 750 may be recorded in compression table 738 for the reference token. Byte position 752 may be determined for a reference token using compression table 738 during decompression and provided to a back end 775. In some embodiments, back end 775 may include an LZ77 or LZ77-based copy back end (for instance, with a (32 KB) history buffer memory). Huffman decoder/parser 740 may provide symbol type and literal byte length 754 to back-end 752.

In some embodiments, Huffman codes may be used to encode the literals, lengths, and/or distances. In such embodiments, the bit distance may be determined at the time when the associated symbol is being encoded as the bit distance may not be available as in a conventional compression process, such as a conventional LZ77 process that are based on distances in the original data. In one embodiment, a static fixed Huffman code may be used for distances. In another embodiment, a Huffman tree encoder may dynamically Huffman-encode the most significant bits of distance and append the least significant bits or start with a certain Huffman code for distances and encode the stream and re-perform the process until convergence (for instance, ratio improvement <1%).

In further embodiments, a compression table may be constructed during the invariant-reference compression process in which each row is a direct map to a byte position in the original data. The invariant-decompression process may therefore use such a direct map compression table having a row per each bit position. A direct map compression table may be more efficient for locating a token during decompression, but may be larger and, therefore, require more storage space.

Figure 8:
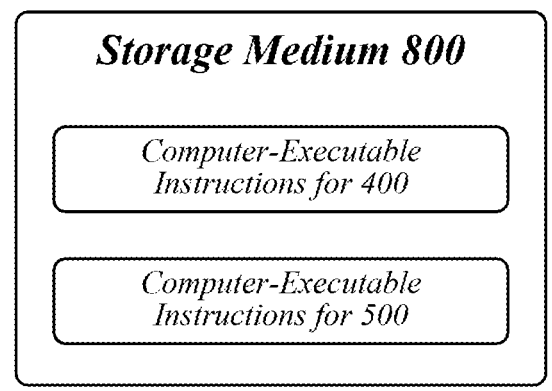
FIG. 8 illustrates an example of a storage medium.

FIG. 8 illustrates an example of a storage medium 800. Storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 400 and/or logic flow 500. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
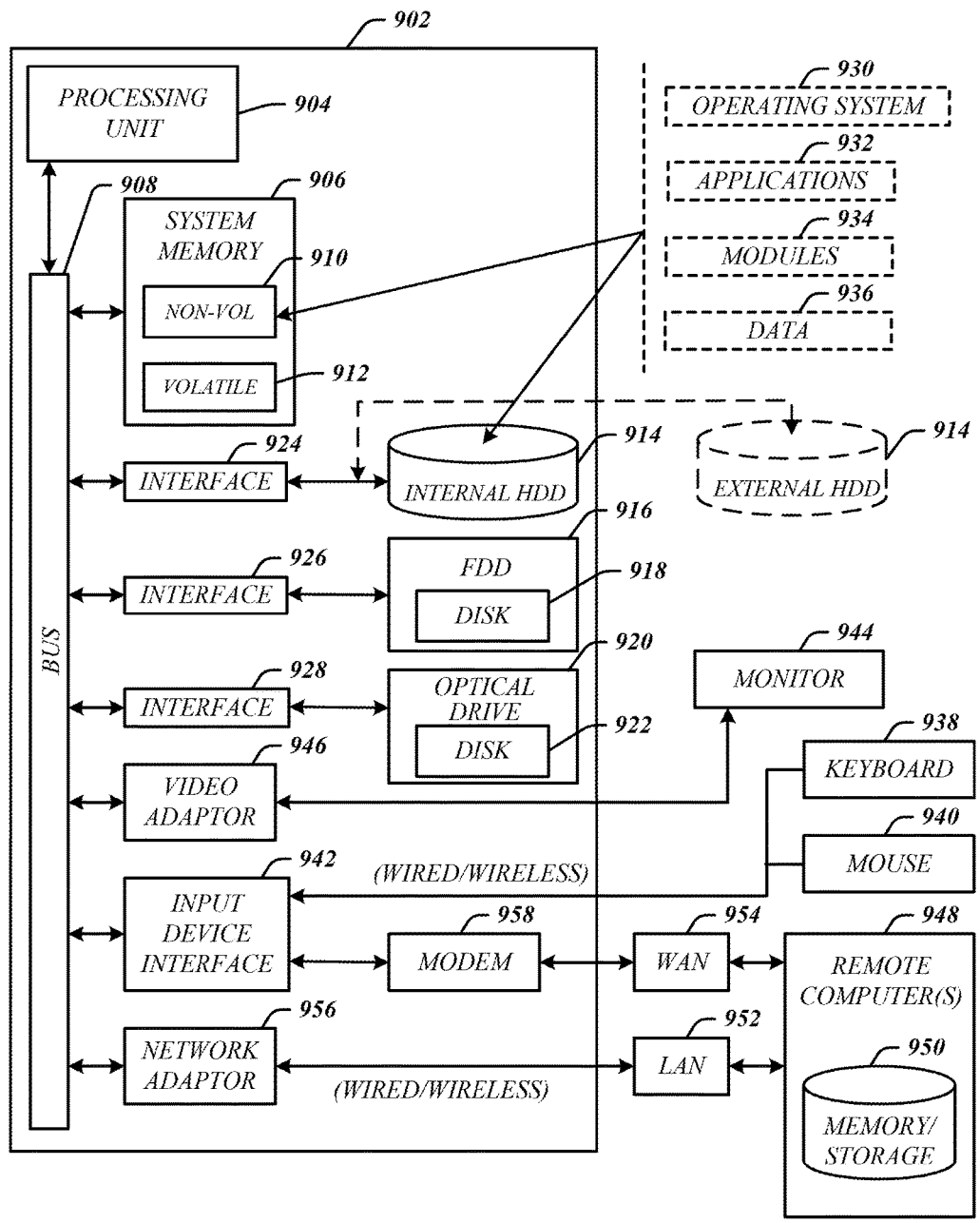
FIG. 9 illustrates an embodiment of a computing architecture.

FIG. 9 illustrates an embodiment of an exemplary computing architecture 900 suitable for implementing various embodiments as previously described. In various embodiments, the computing architecture 900 may comprise or be implemented as part of an electronic device. In some embodiments, the computing architecture 900 may be representative, for example, of apparatus 205. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 900. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 900 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 900.

As shown in FIG. 9, the computing architecture 900 comprises a processing unit 904, a system memory 906 and a system bus 909. The processing unit 904 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 904.

The system bus 909 provides an interface for system components including, but not limited to, the system memory 906 to the processing unit 904. The system bus 909 can be any of several types of bus structure that may further interconnect to a memory bus (with or without a memory controller), a peripheral bus, and a local bus using any of a variety of commercially available bus architectures. Interface adapters may connect to the system bus 909 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 906 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 9, the system memory 906 can include non-volatile memory 910 and/or volatile memory 912. A basic input/output system (BIOS) can be stored in the non-volatile memory 910.

The computer 902 may include various types of computer-readable storage media in the form of one or more lower speed memory units, including an internal (or external) hard disk drive (HDD) 914, a magnetic floppy disk drive (FDD) 916 to read from or write to a removable magnetic disk 919, and an optical disk drive 920 to read from or write to a removable optical disk 922 (e.g., a CD-ROM or DVD). The HDD 914, FDD 916 and optical disk drive 920 can be connected to the system bus 909 by a HDD interface 924, an FDD interface 926 and an optical drive interface 929, respectively. The HDD interface 924 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 910, 912, including an operating system 930, one or more application programs 932, other program modules 934, and program data 936. In one embodiment, the one or more application programs 932, other program modules 934, and program data 936 can include, for example, the various applications and/or components of apparatus 205.

A user can enter commands and information into the computer 902 through one or more wire/wireless input devices, for example, a keyboard 939 and a pointing device, such as a mouse 940. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 904 through an input device interface 942 that is coupled to the system bus 909, but can be connected by other interfaces such as a parallel port, IEEE 1394 serial port, a game port, a USB port, an IR interface, and so forth.

A monitor 944 or other type of display device is also connected to the system bus 909 via an interface, such as a video adaptor 946. The monitor 944 may be internal or external to the computer 802. In addition to the monitor 944, a computer typically includes other peripheral output devices, such as speakers, printers, and so forth.

The computer 902 may operate in a networked environment using logical connections via wire and/or wireless communications to one or more remote computers, such as a remote computer 949. The remote computer 949 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 950 is illustrated. The logical connections depicted include wire/wireless connectivity to a local area network (LAN) 952 and/or larger networks, for example, a wide area network (WAN) 954. Such LAN and WAN networking environments are commonplace in offices and companies, and facilitate enterprise-wide computer networks, such as intranets, all of which may connect to a global communications network, for example, the Internet.

When used in a LAN networking environment, the computer 902 is connected to the LAN 952 through a wire and/or wireless communication network interface or adaptor 956. The adaptor 956 can facilitate wire and/or wireless communications to the LAN 952, which may also include a wireless access point disposed thereon for communicating with the wireless functionality of the adaptor 956.

When used in a WAN networking environment, the computer 902 can include a modem 959, or is connected to a communications server on the WAN 954, or has other means for establishing communications over the WAN 954, such as by way of the Internet. The modem 959, which can be internal or external and a wire and/or wireless device, connects to the system bus 909 via the input device interface 942. In a networked environment, program modules depicted relative to the computer 902, or portions thereof, can be stored in the remote memory/storage device 950. It will be appreciated that the network connections shown are exemplary and other means of establishing a communications link between the computers can be used.

The computer 902 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following include non-limiting examples according to some embodiments:

Example 1 is an apparatus to generate invariant-reference compressed data, the apparatus comprising at least one memory, and logic, at least a portion of comprised in hardware coupled to the at least one memory, to access input data comprising a plurality of literals and a plurality of repeating sequences, and perform an invariant-reference compression process to generate the invariant-reference compressed data, the invariant-reference compression process comprising determining a relative distance for each of the plurality of repeating sequences, the relative distance comprising a bit offset in the invariant-reference compressed data, and encoding each of the plurality of repeating sequences as a reference token in the invariant-reference compressed data, the reference token comprising the relative distance and a length.

Example 2 is the apparatus of Example 1, the input data comprising compressed data compressed using an LZ77 compression process.

Example 3 is the apparatus of Example 1, the input data comprising compressed data compressed using a Deflate compression process.

Example 4 is the apparatus of Example 1, the input data comprising compressed data generated from uncompressed data, the compressed data comprising the plurality of literals and tokens having a backward distance indicating a distance of a repeating sequence in the uncompressed data.

Example 5 is the apparatus of Example 1, the logic to perform the invariant-reference compression process to generate a compression table comprising records for literal tokens and reference tokens of invariant-reference compressed data.

Example 6 is the apparatus of Example 1, the logic to perform the invariant-reference compression process to generate a compression table comprising a plurality of records for a plurality of tokens of invariant-reference compressed data.

Example 7 is the apparatus of Example 1, the logic to perform the invariant-reference compression process to generate a compression table comprising a plurality of records for a plurality of tokens of invariant-reference compressed data, each of the plurality of records comprising a token indicator, a starting bit position, a starting byte position, and a bit length.

Example 8 is the apparatus of Example 1, the logic to perform the invariant-reference compression process to add a record for each of the plurality of literals in a compression table.

Example 9 is the apparatus of Example 1, the logic to perform the invariant-reference compression process to add a record for each of the plurality of literals in a compression table, and store a starting bit position, a starting byte position, and a bit length corresponding to each of the plurality of literals in the record.

Example 10 is the apparatus of Example 1, the logic to perform the invariant-reference compression process to add a record for the reference token in a compression table.

Example 11 is the apparatus of Example 1, the logic to perform the invariant-reference compression process to add a record for the reference token in a compression table, and store a starting bit position, a starting byte position, and a bit length corresponding to the reference token in the record.

Example 12 is the apparatus of Example 1, the logic to perform the invariant-reference compression process to determine a byte position in uncompressed data of the input data for the reference token, determine a record in a compression table corresponding to the byte position, the record comprising a starting bit position, and determine a bit offset for the reference token as the difference between a current bit count and the starting bit position.

Example 13 is the apparatus of Example 1, the logic to perform an invariant-reference decompression process to decode a compressed token of the invariant-reference compressed data, determine that the compressed token is a literal token responsive to a length value of the compressed token being greater than a literal threshold value, and copy the literal token to decompressed data output.

Example 14 is the apparatus of Example 1, the logic to perform an invariant-reference decompression process to decode a compressed token of the invariant-reference compressed data, determine that the compressed token is a reference token responsive to a length value of the compressed token being greater than a literal threshold value, determine a start byte position for the reference token, and copy bytes from the start byte position for the length value to decompressed data output.

Example 15 is a system, comprising the apparatus according to any of Examples 1-14, and at least one network interface.

Example 16 is a method to generate invariant-reference compressed data, the method comprising accessing input data comprising a plurality of literals and a plurality of repeating sequences, and performing an invariant-reference compression process to generate the invariant-reference compressed data, the invariant-reference compression process comprising determining a relative distance for each of the plurality of repeating sequences, the relative distance comprising a bit offset in the invariant-reference compressed data, and encoding each of the plurality of repeating sequences as a reference token in the invariant-reference compressed data, the reference token comprising the relative distance and a length.

Example 17 is the method of Example 16, the input data comprising compressed data compressed using an LZ77 compression process.

Example 18 is the method of Example 16, the input data comprising compressed data compressed using a Deflate compression process.

Example 19 is the method of Example 16, the input data comprising compressed data generated from uncompressed data, the compressed data comprising the plurality of literals and tokens having a backward distance indicating a distance of a repeating sequence in the uncompressed data.

Example 20 is the method of Example 16, comprising performing the invariant-reference compression process to generate a compression table comprising records for literal tokens and reference tokens of invariant-reference compressed data.

Example 21 is the method of Example 16, comprising performing the invariant-reference compression process to generate a compression table comprising a plurality of records for a plurality of tokens of invariant-reference compressed data.

Example 22 is the method of Example 16, comprising performing the invariant-reference compression process to generate a compression table comprising a plurality of records for a plurality of tokens of invariant-reference compressed data, each of the plurality of records comprising a token indicator, a starting bit position, a starting byte position, and a bit length.

Example 23 is the method of Example 16, comprising performing the invariant-reference compression process to add a record for each of the plurality of literals in a compression table.

Example 24 is the method of Example 16, comprising perform the invariant-reference compression process to add a record for each of the plurality of literals in a compression table, and store a starting bit position, a starting byte position, and a bit length corresponding to each of the plurality of literals in the record.

Example 25 is the method of Example 16, comprising performing the invariant-reference compression process to add a record for the reference token in a compression table.

Example 26 is the method of Example 16, comprising performing the invariant-reference compression process to add a record for the reference token in a compression table, and store a starting bit position, a starting byte position, and a bit length corresponding to the reference token in the record.

Example 27 is the method of Example 16, comprising performing the invariant-reference compression process to determine a byte position in uncompressed data of the input data for the reference token, determine a record in a compression table corresponding to the byte position, the record comprising a starting bit position, and determine a bit offset for the reference token as the difference between a current bit count and the starting bit position.

Example 28 is the method of Example 16, comprising performing an invariant-reference decompression process to decode a compressed token of the invariant-reference compressed data, determine that the compressed token is a literal token responsive to a length value of the compressed token being greater than a literal threshold value, and copy the literal token to decompressed data output.

Example 29 is the method of Example 16, comprising performing an invariant-reference decompression process to decode a compressed token of the invariant-reference compressed data, determine that the compressed token is a reference token responsive to a length value of the compressed token being greater than a literal threshold value, determine a start byte position for the reference token, and copy bytes from the start byte position for the length value to decompressed data output.

Example 30 is a non-transitory computer-readable storage medium that stores computer-executable instructions for execution by processing circuitry of a computing device to generate invariant-reference compressed data, the computer-executable instructions, when executed, to cause the computing device to access input data comprising a plurality of literals and a plurality of repeating sequences, and perform an invariant-reference compression process to generate the invariant-reference compressed data, the invariant-reference compression process comprising determining a relative distance for each of the plurality of repeating sequences, the relative distance comprising a bit offset in the invariant-reference compressed data, and encoding each of the plurality of repeating sequences as a reference token in the invariant-reference compressed data, the reference token comprising the relative distance and a length.

Example 31 is the computer-readable storage medium of Example 30, the input data comprising compressed data compressed using an LZ77 compression process.

Example 32 is the computer-readable storage medium of Example 30, the input data comprising compressed data compressed using a Deflate compression process.

Example 33 is the computer-readable storage medium of Example 30, the input data comprising compressed data generated from uncompressed data, the compressed data comprising the plurality of literals and tokens having a backward distance indicating a distance of a repeating sequence in the uncompressed data.

Example 34 is the computer-readable storage medium of Example 30, the computer-executable instructions, when executed, to cause the computing device to perform the invariant-reference compression process to generate a compression table comprising records for literal tokens and reference tokens of invariant-reference compressed data.

Example 35 is the computer-readable storage medium of Example 30, the computer-executable instructions, when executed, to cause the computing device to perform the invariant-reference compression process to generate a compression table comprising a plurality of records for a plurality of tokens of invariant-reference compressed data.

Example 36 is the computer-readable storage medium of Example 30, the computer-executable instructions, when executed, to cause the computing device to perform the invariant-reference compression process to generate a compression table comprising a plurality of records for a plurality of tokens of invariant-reference compressed data, each of the plurality of records comprising a token indicator, a starting bit position, a starting byte position, and a bit length.

Example 37 is the computer-readable storage medium of Example 30, the computer-executable instructions, when executed, to cause the computing device to perform the invariant-reference compression process to add a record for each of the plurality of literals in a compression table.

Example 38 is the computer-readable storage medium of Example 30, the computer-executable instructions, when executed, to cause the computing device to perform the invariant-reference compression process to add a record for each of the plurality of literals in a compression table, and store a starting bit position, a starting byte position, and a bit length corresponding to each of the plurality of literals in the record.

Example 39 is the computer-readable storage medium of Example 30, the computer-executable instructions, when executed, to cause the computing device to perform the invariant-reference compression process to add a record for the reference token in a compression table.

Example 40 is the computer-readable storage medium of Example 30, the computer-executable instructions, when executed, to cause the computing device to perform the invariant-reference compression process to add a record for the reference token in a compression table, and store a starting bit position, a starting byte position, and a bit length corresponding to the reference token in the record.

Example 41 is the computer-readable storage medium of Example 30, the computer-executable instructions, when executed, to cause the computing device to perform the invariant-reference compression process to determine a byte position in uncompressed data of the input data for the reference token, determine a record in a compression table corresponding to the byte position, the record comprising a starting bit position, and determine a bit offset for the reference token as the difference between a current bit count and the starting bit position.

Example 42 is the computer-readable storage medium of Example 30, the computer-executable instructions, when executed, to cause the computing device to perform an invariant-reference decompression process to decode a compressed token of the invariant-reference compressed data, determine that the compressed token is a literal token responsive to a length value of the compressed token being greater than a literal threshold value, and copy the literal token to decompressed data output.

Example 43 is the computer-readable storage medium of Example 30, the computer-executable instructions, when executed, to cause the computing device to perform an invariant-reference decompression process to decode a compressed token of the invariant-reference compressed data, determine that the compressed token is a reference token responsive to a length value of the compressed token being greater than a literal threshold value, determine a start byte position for the reference token, and copy bytes from the start byte position for the length value to decompressed data output.

Example 44 is an apparatus to generate invariant-reference compressed data, the apparatus comprising a data input means to access input data comprising a plurality of literals and a plurality of repeating sequences, and an invariant-reference compression means to determine a relative distance for each of the plurality of repeating sequences, the relative distance comprising a bit offset in the invariant-reference compressed data, and encode each of the plurality of repeating sequences as a reference token in the invariant-reference compressed data, the reference token comprising the relative distance and a length.

Example 45 is the apparatus of Example 44, the input data comprising compressed data compressed using an LZ77 compression process.

Example 46 is the apparatus of Example 44, the input data comprising compressed data compressed using a Deflate compression process.

Example 47 is the apparatus of Example 44, the input data comprising compressed data generated from uncompressed data, the compressed data comprising the plurality of literals and tokens having a backward distance indicating a distance of a repeating sequence in the uncompressed data.

Example 48 is the apparatus of Example 44, the invariant-reference compression means to generate a compression table comprising records for literal tokens and reference tokens of invariant-reference compressed data.

Example 49 is the apparatus of Example 44, the invariant-reference compression means to generate a compression table comprising a plurality of records for a plurality of tokens of invariant-reference compressed data.

Example 50 is the apparatus of Example 44, the invariant-reference compression means to generate a compression table comprising a plurality of records for a plurality of tokens of invariant-reference compressed data, each of the plurality of records comprising a token indicator, a starting bit position, a starting byte position, and a bit length.

Example 51 is the apparatus of Example 44, the invariant-reference compression means to add a record for each of the plurality of literals in a compression table.

Example 52 is the apparatus of Example 44, the invariant-reference compression means to add a record for each of the plurality of literals in a compression table, and store a starting bit position, a starting byte position, and a bit length corresponding to each of the plurality of literals in the record.

Example 53 is the apparatus of Example 44, the invariant-reference compression means to add a record for the reference token in a compression table.

Example 54 is the apparatus of Example 44, the invariant-reference compression means to add a record for the reference token in a compression table, and store a starting bit position, a starting byte position, and a bit length corresponding to the reference token in the record.

Example 55 is the apparatus of Example 44, the invariant-reference compression means to determine a byte position in uncompressed data of the input data for the reference token, determine a record in a compression table corresponding to the byte position, the record comprising a starting bit position, and determine a bit offset for the reference token as the difference between a current bit count and the starting bit position.

Example 56 is the apparatus of Example 44, the invariant-reference compression means to decode a compressed token of the invariant-reference compressed data, determine that the compressed token is a literal token responsive to a length value of the compressed token being greater than a literal threshold value, and copy the literal token to decompressed data output.

Example 57 is the apparatus of Example 44, the invariant-reference compression means to decode a compressed token of the invariant-reference compressed data, determine that the compressed token is a reference token responsive to a length value of the compressed token being greater than a literal threshold value, determine a start byte position for the reference token, and copy bytes from the start byte position for the length value to decompressed data output.

Example 58 is a system, comprising the apparatus according to any of Examples 44-57, and at least one network interface.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus to generate invariant-reference compressed data, the apparatus comprising:
   at least one memory; and
   logic, at least a portion of comprised in hardware coupled to the at least one memory, to:
      access input data comprising a plurality of literals and a plurality of repeating sequences; and
      perform an invariant-reference compression process to generate the invariant-reference compressed data, the invariant-reference compression process comprising:
         determining a relative distance for each of the plurality of repeating sequences, the relative distance comprising a bit offset in the invariant-reference compressed data; and
         encoding each of the plurality of repeating sequences as a reference token in the invariant-reference compressed data, the reference token comprising the relative distance and a length.

2. The apparatus of claim 1, the input data comprising compressed data compressed using an LZ77 compression process.

3. The apparatus of claim 1, the input data comprising compressed data generated from uncompressed data, the compressed data comprising the plurality of literals and tokens having a backward distance indicating a distance of a repeating sequence in the uncompressed data.

4. The apparatus of claim 1, the logic to perform the invariant-reference compression process to generate a compression table comprising records for literal tokens and reference tokens of invariant-reference compressed data.

5. The apparatus of claim 1, the logic to perform the invariant-reference compression process to generate a compression table comprising a plurality of records for a plurality of tokens of invariant-reference compressed data, each of the plurality of records comprising a token indicator, a starting bit position, a starting byte position, and a bit length.

6. The apparatus of claim 1, the logic to perform the invariant-reference compression process to:
add a record for each of the plurality of literals in a compression table; and
store a starting bit position, a starting byte position, and a bit length corresponding to each of the plurality of literals in the record.

7. The apparatus of claim 1, the logic to perform the invariant-reference compression process to:
add a record for the reference token in a compression table; and
store a starting bit position, a starting byte position, and a bit length corresponding to the reference token in the record.

8. The apparatus of claim 1, the logic to perform the invariant-reference compression process to:
determine a byte position in uncompressed data of the input data for the reference token;
determine a record in a compression table corresponding to the byte position, the record comprising a starting bit position; and
determine a bit offset for the reference token as the difference between a current bit count and the starting bit position.

9. The apparatus of claim 1, the logic to perform an invariant-reference decompression process to:
decode a compressed token of the invariant-reference compressed data;
determine that the compressed token is a literal token responsive to a length value of the compressed token being greater than a literal threshold value; and
copy the literal token to decompressed data output.

10. The apparatus of claim 1, the logic to perform an invariant-reference decompression process to:
decode a compressed token of the invariant-reference compressed data;
determine that the compressed token is a reference token responsive to a length value of the compressed token being greater than a literal threshold value;
determine a start byte position for the reference token; and
copy bytes from the start byte position for the length value to decompressed data output.

11. A method to generate invariant-reference compressed data, the method comprising:
accessing input data comprising a plurality of literals and a plurality of repeating sequences; and
performing an invariant-reference compression process to generate the invariant-reference compressed data, the invariant-reference compression process comprising:
determining a relative distance for each of the plurality of repeating sequences, the relative distance comprising a bit offset in the invariant-reference compressed data; and
encoding each of the plurality of repeating sequences as a reference token in the invariant-reference compressed data, the reference token comprising the relative distance and a length.

12. The method of claim 11, the input data comprising compressed data compressed using an LZ77 compression process.

13. The method of claim 11, the input data comprising compressed data generated from uncompressed data, the compressed data comprising the plurality of literals and tokens having a backward distance indicating a distance of a repeating sequence in the uncompressed data.

14. The method of claim 11, comprising performing the invariant-reference compression process to generate a compression table comprising records for literal tokens and reference tokens of invariant-reference compressed data.

15. The method of claim 11, comprising performing the invariant-reference compression process to generate a compression table comprising a plurality of records for a plurality of tokens of invariant-reference compressed data, each of the plurality of records comprising a token indicator, a starting bit position, a starting byte position, and a bit length.

16. The method of claim 11, comprising perform the invariant-reference compression process to:
add a record for each of the plurality of literals in a compression table; and
store a starting bit position, a starting byte position, and a bit length corresponding to each of the plurality of literals in the record.

17. The method of claim 11, comprising performing the invariant-reference compression process to:
add a record for the reference token in a compression table; and
store a starting bit position, a starting byte position, and a bit length corresponding to the reference token in the record.

18. The method of claim 11, comprising performing the invariant-reference compression process to:
determine a byte position in uncompressed data of the input data for the reference token;
determine a record in a compression table corresponding to the byte position, the record comprising a starting bit position; and
determine a bit offset for the reference token as the difference between a current bit count and the starting bit position.

19. The method of claim 11, comprising performing an invariant-reference decompression process to:
decode a compressed token of the invariant-reference compressed data;
determine that the compressed token is a literal token responsive to a length value of the compressed token being greater than a literal threshold value; and
copy the literal token to decompressed data output.

20. The method of claim 11, comprising performing an invariant-reference decompression process to:
decode a compressed token of the invariant-reference compressed data;
determine that the compressed token is a reference token responsive to a length value of the compressed token being greater than a literal threshold value;
determine a start byte position for the reference token; and
copy bytes from the start byte position for the length value to decompressed data output.

21. A non-transitory computer-readable storage medium that stores computer-executable instructions for execution by processing circuitry of a computing device to generate invariant-reference compressed data, the computer-executable instructions, when executed, to cause the computing device to:
access input data comprising a plurality of literals and a plurality of repeating sequences; and
perform an invariant-reference compression process to generate the invariant-reference compressed data, the invariant-reference compression process comprising:
determining a relative distance for each of the plurality of repeating sequences, the relative distance comprising a bit offset in the invariant-reference compressed data; and encoding each of the plurality of repeating sequences as a reference token in the invariant-reference compressed data, the reference token comprising the relative distance and a length.

22. The non-transitory computer-readable storage medium of claim 21, the input data comprising compressed data generated from uncompressed data, the compressed data comprising the plurality of literals and tokens having a backward distance indicating a distance of a repeating sequence in the uncompressed data.

23. The non-transitory computer-readable storage medium of claim 21, the computer-executable instructions, when executed, to cause the computing device to perform the invariant-reference compression process to generate a compression table comprising a plurality of records for a plurality of tokens of invariant-reference compressed data, each of the plurality of records comprising a token indicator, a starting bit position, a starting byte position, and a bit length.

24. The non-transitory computer-readable storage medium of claim 21, the computer-executable instructions, when executed, to cause the computing device to perform the invariant-reference compression process to:
   add a record for each of the plurality of literals in a compression table; and
   store a starting bit position, a starting byte position, and a bit length corresponding to each of the plurality of literals in the record.

25. The non-transitory computer-readable storage medium of claim 21, the computer-executable instructions, when executed, to cause the computing device to perform the invariant-reference compression process to:
   add a record for the reference token in a compression table; and
store a starting bit position, a starting byte position, and a bit length corresponding to the reference token in the record.

* * * * *

UNITED STATES PATENT AND TRADEMARK OFFICE
CERTIFICATE OF CORRECTION

PATENT NO. : 9,998,142 B1  
APPLICATION NO. : 15/718303  
DATED : June 12, 2018  
INVENTOR(S) : Vinodh Gopal Page 1 of 1

It is certified that error appears in the above-identified patent and that said Letters Patent is hereby corrected as shown below:

In the Specification

Column 5, Line 21, replace "Broth" with -- Brotli --.

Signed and Sealed this
Twenty-fifth Day of September, 2018

Andrei Iancu
*Director of the United States Patent and Trademark Office*